(12) United States Patent
Price

(10) Patent No.: US 12,477,754 B2
(45) Date of Patent: Nov. 18, 2025

(54) THIN-FILM COMPONENTS FOR INTEGRATED CIRCUITS

(71) Applicant: PRAGMATIC SEMICONDUCTOR LIMITED, Cambridge (GB)

(72) Inventor: Richard Price, Sedgefield (GB)

(73) Assignee: PRAGMATIC SEMICONDUCTOR LIMITED, Cambridge (GB)

( * ) Notice: Subject to any disclaimer, the term of this patent is extended or adjusted under 35 U.S.C. 154(b) by 490 days.

(21) Appl. No.: 17/636,113

(22) PCT Filed: Aug. 19, 2020

(86) PCT No.: PCT/GB2020/051990
§ 371 (c)(1),
(2) Date: Feb. 17, 2022

(87) PCT Pub. No.: WO2021/032981
PCT Pub. Date: Feb. 25, 2021

(65) Prior Publication Data
US 2022/0293797 A1    Sep. 15, 2022

(30) Foreign Application Priority Data

Aug. 21, 2019 (GB) ........................ 1912025
Sep. 20, 2019 (GB) ........................ 1913610
(Continued)

(51) Int. Cl.
*H10D 1/47* (2025.01)
*H01C 1/01* (2006.01)
(Continued)

(52) U.S. Cl.
CPC ............... *H10D 1/474* (2025.01); *H01C 1/01* (2013.01); *H01C 1/14* (2013.01); *H01C 7/006* (2013.01);
(Continued)

(58) Field of Classification Search
CPC .... H10D 1/474; H10D 99/00; H10D 30/6757; H10D 86/0221; H10D 84/811;
(Continued)

(56) References Cited

U.S. PATENT DOCUMENTS 3,996,551 A    12/1976  Croson
4,609,903 A    9/1986   Toyokura et al.
(Continued)

FOREIGN PATENT DOCUMENTS

CN    1359156 A    7/2002
CN    1409400 A    4/2003
(Continued)

OTHER PUBLICATIONS

Klibanov, Lev "Integrated Resistors for an Advanced Node Cmos" EE Times; Nov. 16, 2016.
(Continued)

*Primary Examiner* — Zandra V Smith
*Assistant Examiner* — Andre C Stevenson
(74) *Attorney, Agent, or Firm* — Jason H Vick; Amped IP LLC

(57) ABSTRACT

A thin-film electronic component includes a first terminal, a second terminal, and a first current path between the first terminal and the second terminal, wherein the first current path is formed from a first segment of a first material and a first segment of a second material arranged in series between the first terminal and the second terminal.

17 Claims, 6 Drawing Sheets

(30) Foreign Application Priority Data

Oct. 18, 2019 (GB) ..................................... 1915158
Nov. 22, 2019 (GB) ..................................... 1917079

(51) Int. Cl.

| | | |
|---|---|---|
| H01C 1/14 | (2006.01) | |
| H01C 7/00 | (2006.01) | |
| H01C 17/00 | (2006.01) | |
| H01C 17/075 | (2006.01) | |
| H01C 17/28 | (2006.01) | |
| H01L 21/02 | (2006.01) | |
| H10D 8/60 | (2025.01) | |
| H10D 30/67 | (2025.01) | |
| H10D 62/80 | (2025.01) | |
| H10D 84/00 | (2025.01) | |
| H10D 84/02 | (2025.01) | |
| H10D 84/80 | (2025.01) | |
| H10D 86/01 | (2025.01) | |
| H10D 86/40 | (2025.01) | |
| H10D 86/60 | (2025.01) | |
| H10D 86/80 | (2025.01) | |
| H10D 99/00 | (2025.01) | |

(52) U.S. Cl.
CPC ......... *H01C 17/003* (2013.01); *H01C 17/075* (2013.01); *H01C 17/28* (2013.01); *H01L 21/02565* (2013.01); *H10D 1/47* (2025.01); *H10D 8/60* (2025.01); *H10D 30/6755* (2025.01); *H10D 30/6757* (2025.01); *H10D 62/80* (2025.01); *H10D 84/02* (2025.01); *H10D 84/204* (2025.01); *H10D 84/811* (2025.01); *H10D 86/0221* (2025.01); *H10D 86/423* (2025.01); *H10D 86/481* (2025.01); *H10D 86/60* (2025.01); *H10D 86/80* (2025.01); *H10D 99/00* (2025.01)

(58) Field of Classification Search
CPC ........ H10D 8/60; H10D 84/204; H10D 86/60; H10D 1/47; H10D 86/80; H10D 30/6755; H10D 62/80; H10D 84/02; H10D 86/481; H10D 86/423; H01C 1/01; H01C 1/14; H01C 7/006; H01C 17/003; H01C 17/075; H01C 17/28; H01L 21/02565
See application file for complete search history.

(56) References Cited

U.S. PATENT DOCUMENTS

| | | |
|---|---|---|
| 5,466,484 A | 11/1995 | Spraggins et al. |
| 5,489,547 A | 2/1996 | Erdeljac et al. |
| 5,872,381 A | 2/1999 | Kato et al. |
| 5,930,638 A | 7/1999 | Reedy et al. |
| 6,403,438 B1 | 6/2002 | Santangelo |
| 7,183,593 B2 | 2/2007 | Yeo et al. |
| 7,633,373 B1 | 12/2009 | Johnson et al. |
| 8,343,819 B2 | 1/2013 | Doris et al. |
| 8,513,723 B2 | 8/2013 | Booth, Jr. et al. |
| 9,406,872 B1 | 8/2016 | Annunziata et al. |
| 9,446,946 B2 | 9/2016 | Schalberger et al. |
| 10,204,683 B2 | 2/2019 | Price et al. |
| 11,316,518 B2 | 4/2022 | De Oliveira |
| 11,575,380 B2 | 2/2023 | De Oliveira |
| 2001/0041412 A1 | 11/2001 | Takasu |
| 2002/0084487 A1 | 7/2002 | Takasu |
| 2002/0084492 A1 | 7/2002 | Osanai et al. |
| 2003/0047782 A1 | 3/2003 | Hasegawa et al. |
| 2004/0183130 A1 | 9/2004 | Dara |
| 2005/0035409 A1 | 2/2005 | Ko et al. |
| 2005/0074929 A1 | 4/2005 | Hasegawa et al. |
| 2005/0181589 A1 | 8/2005 | Miyawaki |
| 2005/0242349 A1 | 11/2005 | Lee et al. |
| 2005/0253178 A1 | 11/2005 | Yamaguchi et al. |
| 2006/0091793 A1 | 5/2006 | Baude et al. |
| 2006/0145296 A1 | 7/2006 | Coolbaugh et al. |
| 2006/0189049 A1 | 8/2006 | Afentakis et al. |
| 2006/0249793 A1* | 11/2006 | Beach ................... H01C 7/006 257/E27.047 |
| 2007/0041141 A1 | 2/2007 | Deng |
| 2007/0046421 A1 | 3/2007 | Gogineni et al. |
| 2008/0237800 A1 | 10/2008 | Chinthakindi et al. |
| 2009/0090977 A1 | 4/2009 | Freeman et al. |
| 2010/0013026 A1 | 1/2010 | Booth, Jr. et al. |
| 2010/0079169 A1 | 4/2010 | Kim et al. |
| 2010/0148168 A1 | 6/2010 | Lai et al. |
| 2010/0156588 A1 | 6/2010 | Privitera |
| 2011/0012112 A1 | 1/2011 | Yamazaki et al. |
| 2011/0012117 A1 | 1/2011 | Yamazaki et al. |
| 2011/0057918 A1 | 3/2011 | Kimura et al. |
| 2011/0097860 A1 | 4/2011 | Iida |
| 2011/0133177 A1 | 6/2011 | Suzawa et al. |
| 2011/0169089 A1 | 7/2011 | Doris et al. |
| 2011/0175152 A1 | 7/2011 | Booth, Jr. et al. |
| 2012/0098071 A1 | 4/2012 | Aggarwal et al. |
| 2012/0187493 A1 | 7/2012 | Doris et al. |
| 2013/0092924 A1 | 4/2013 | Sasagawa et al. |
| 2013/0221346 A1 | 8/2013 | Lu et al. |
| 2013/0309808 A1 | 11/2013 | Zhang et al. |
| 2013/0328169 A1 | 12/2013 | Choi |
| 2014/0021583 A1 | 1/2014 | Lo et al. |
| 2014/0027702 A1 | 1/2014 | Lu et al. |
| 2014/0306219 A1 | 10/2014 | Yamazaki et al. |
| 2015/0093844 A1 | 4/2015 | Hsia et al. |
| 2015/0155313 A1 | 6/2015 | Yamazaki et al. |
| 2015/0162396 A1 | 6/2015 | Yagi et al. |
| 2015/0187878 A1 | 7/2015 | Yamazaki et al. |
| 2015/0294984 A1 | 10/2015 | Cheng et al. |
| 2015/0318340 A1 | 11/2015 | Dirnecker |
| 2016/0093638 A1 | 3/2016 | Cheng et al. |
| 2016/0123817 A1 | 5/2016 | Bennett et al. |
| 2016/0141312 A1 | 5/2016 | Nakatani et al. |
| 2016/0163738 A1 | 6/2016 | Sato |
| 2016/0233338 A1 | 8/2016 | Lu et al. |
| 2016/0329392 A1 | 11/2016 | Miyake |
| 2017/0125604 A1 | 5/2017 | Oshima |
| 2017/0162646 A1 | 6/2017 | Lee et al. |
| 2017/0301796 A1 | 10/2017 | Ishihara et al. |
| 2018/0019297 A1* | 1/2018 | Dirnecker ............. H01L 21/268 |
| 2018/0046004 A1 | 2/2018 | Yamazaki et al. |
| 2018/0261664 A1 | 9/2018 | Dirnecker et al. |
| 2018/0337288 A1 | 11/2018 | Shin |
| 2019/0019859 A1 | 1/2019 | Daigle et al. |
| 2019/0148361 A1 | 5/2019 | Lu et al. |
| 2019/0221516 A1 | 7/2019 | Kande et al. |
| 2019/0346500 A1 | 11/2019 | Ren et al. |
| 2020/0135445 A1 | 4/2020 | Yamazaki et al. |
| 2020/0295126 A1 | 9/2020 | Agam et al. |
| 2021/0226629 A1 | 7/2021 | De Oliveira |
| 2022/0216871 A1 | 7/2022 | De Oliveira |
| 2023/0238377 A1 | 7/2023 | Price et al. |

FOREIGN PATENT DOCUMENTS

| | | |
|---|---|---|
| CN | 1722448 A | 1/2006 |
| CN | 102576732 A | 7/2012 |
| CN | 103311128 A | 9/2013 |
| CN | 106463507 A | 2/2017 |
| CN | 107305843 A | 10/2017 |
| CN | 109786365 A | 5/2019 |
| CN | 114556495 A | 5/2022 |
| CN | 114556603 A | 5/2022 |
| CN | 114600234 A | 6/2022 |
| DE | 102020000633 A1 | 9/2020 |
| EP | 1063630 A2 | 12/2000 |
| EP | 2202802 A1 | 6/2010 |
| EP | 3236503 A1 | 10/2017 |
| EP | 2979302 B1 | 12/2020 |
| GB | 727505 A | 4/1955 |
| GB | 2490752 A | 11/2012 |
| GB | 2525184 A | 10/2015 |

(56) References Cited

FOREIGN PATENT DOCUMENTS

| | | | |
|---|---|---|---|
| GB | 2561004 | A | 10/2018 |
| GB | 2570569 | A | 7/2019 |
| GB | 2586520 | A | 2/2021 |
| GB | 2586522 | A | 2/2021 |
| GB | 2587793 | A | 4/2021 |
| GB | 2589937 | A | 6/2021 |
| GB | 2586520 | A9 | 10/2021 |
| GB | 2598074 | A | 2/2022 |
| GB | 2602408 | A | 6/2022 |
| GB | 2610886 | A | 3/2023 |
| JP | S 60-94757 | A | 5/1985 |
| JP | 2003-007847 | A | 1/2003 |
| JP | 2002-124641 | A | 4/2004 |
| JP | 2008-124188 | A | 5/2008 |
| JP | 2010-087518 | A | 4/2010 |
| JP | 2010-225725 | A | 10/2010 |
| JP | 2011-077106 | A | 4/2011 |
| JP | 2018-006412 | A | 1/2018 |
| JP | 2018-137423 | A | 8/2018 |
| WO | WO 89/03121 | A1 | 4/1989 |
| WO | WO 93/07629 | A | 4/1993 |
| WO | WO 2012/071878 | A1 | 6/2012 |
| WO | WO 2015/079362 | A1 | 6/2015 |
| WO | WO 2015/097597 | A1 | 7/2015 |
| WO | WO 2018/004672 | A1 | 1/2018 |
| WO | WO 2018/197988 | A1 | 11/2018 |
| WO | WO 2019/116020 | A1 | 6/2019 |
| WO | WO 2021/032977 | A1 | 2/2021 |
| WO | WO 2021/032978 | A1 | 2/2021 |
| WO | WO 2021/032979 | A1 | 2/2021 |
| WO | WO 2021/032980 | A1 | 2/2021 |

OTHER PUBLICATIONS

Wikipedia "Multiple Patterning" Available at https://en.wikipedia.org/w/index.php?title=Multiple_patterning&oldid=914700788; Sep. 8, 2019.
Examination Report Under Section 18(3) for Great Britain Application No. 2000887.6 mailed Mar. 27, 2023.
U.S. Appl. No. 17/636,083, filed Feb. 17, 2022, Price et al.
U.S. Appl. No. 17/636,090, filed Feb. 17, 2022, Price et al.
U.S. Appl. No. 17/636,099, filed Feb. 17, 2022, Price.
U.S. Appl. No. 17/636,108, filed Feb. 17, 2022, Price.
Kawakita, Masatoshi et al. "Laterally Configured Resistive Switching Device Based on Transition-Metal Nano-Gap Electrode on Gd Oxide" Applied Physics Letters 108, 023101 (2016).
Mack, Chris A. "Seeing Double" IEEE Spectrum; Nov. 1, 2008.
Nayak, Pradipta K. et al. "Thin Film Complementary Metal Oxide Semiconductor (CMOS) Device Using a Single-Step Deposition of the Channel Layer" Scientific Reports; 4: 4672; Apr. 14, 2014.
International Search Report for International Application No. PCT/GB2020/051987, mailed Nov. 26, 2020.
Written Opinion for International Application No. PCT/GB2020/051987, mailed Nov. 26, 2020.
Invitation to Pay Additional Fees and, Where Applicable, Protest Fee for International Application No. PCT/GB2020/051986, mailed Nov. 5, 2020.
International Search Report for International Application No. PCT/GB2020/051986, mailed Jan. 13, 2021.
Written Opinion for International Application No. PCT/GB2020/051986, mailed Jan. 13, 2021.
International Search Report for International Application No. PCT/GB2020/051988, mailed Nov. 2, 2020.
Written Opinion for International Application No. PCT/GB2020/051988, mailed Nov. 2, 2020.
Invitation to Pay Additional Fees and, Where Applicable, Protest Fee for International Application No. PCT/GB2020/051989, mailed Nov. 25, 2020.
International Search Report for International Application No. PCT/GB2020/051989, mailed Feb. 8, 2021.
Written Opinion for International Application No. PCT/GB2020/051989, mailed Feb. 8, 2021.
Invitation to Pay Additional Fees and, Where Applicable, Protest Fee for International Application No. PCT/GB2020/051990, mailed Nov. 2, 2020.
International Search Report for International Application No. PCT/GB2020/051990, mailed Dec. 23, 2020.
Written Opinion for International Application No. PCT/GB2020/051990, mailed Dec. 23, 2020.
Combined Search and Examination Report Under Sections 17 and 18(3) for Great Britain Application No. 1912025.2, mailed Jan. 28, 2020.
Examination Report Under Section 18(3) for Great Britain Application No. 1912025.2, mailed Jan. 17, 2022.
Search Report Under Section 17(5) for Great Britain Application No. 2000887.6 mailed Jul. 22, 2020.
Search Report Under Section 17(6) for Great Britain Application No. 2000887.6 mailed Mar. 3, 2021.
Combined Search and Examination Report Under Sections 17 and 18(3) for Great Britain Application No. 1913610.0, mailed Mar. 11, 2020.
Examination Report Under Section 18(3) for Great Britain Application No. 1913610.0, mailed Sep. 10, 2021.
Combined Search and Examination Report Under Sections 17 and 18(3) for Great Britain Application No. GB 1915158.8, mailed Apr. 20, 2020.
Combined Search and Examination Report Under Sections 17 and 18(3) for Great Britain Application No. 1917079.4, mailed May 7, 2020.
Search Report Under Section 17(6) for Great Britain Application No. 1917079.4, mailed Mar. 22, 2021.
Examination Report Under Section 18(3) for Great Britain Application No. 1917079.4, mailed Aug. 25, 2021.
Combined Search and Examination Report Under Sections 17 and 18(3) for Great Britain Application No. 2117276.2, mailed Dec. 14, 2021.
Combined Search and Examination Report Under Sections 17 and 18(3), for corresponding Great Britain Application No. 2202910.2, mailed Apr. 5, 2022.
Notification of First Office Action (Including Translation) for corresponding Chinese Patent Application No. 202080071825.6, mailed Dec. 27, 2023.
Office Action (Restriction Requirement) for U.S. Appl. No. 17/636,099, mailed Dec. 29, 2023.
International Preliminary Report on Patentability for International Application No. PCT/GB2020/051987, mailed Mar. 3, 2022.
International Preliminary Report on Patentability for International Application No. PCT/GB2020/051986, mailed Mar. 3, 2022.
International Preliminary Report on Patentability for International Application No. PCT/GB2020/051988, mailed Mar. 3, 2022.
International Preliminary Report on Patentability for International Application No. PCT/GB2020/051989, mailed Mar. 3, 2022.
International Preliminary Report on Patentability for International Application No. PCT/GB2020/051990, mailed Mar. 3, 2022.
Office Action (Restriction Requirement) for U.S. Appl. No. 17/636,083, mailed Mar. 6, 2024.
Office Action for U.S. Appl. No. 17/636,099, mailed Feb. 29, 2024.
Office Action for corresponding European Patent Application No. 20764719.9, mailed Jun. 25, 2024.
Office Action for corresponding European Patent Application No. 20764722.3, mailed Jun. 7, 2024.
Notification of Second Office Action (Including Translation) for corresponding Chinese Patent Application No. 202080071825.6, mailed Jul. 15, 2024.
Office Action for U.S. Appl. No. 17/636,083, mailed Aug. 9, 2024.
Notice of Allowance for U.S. Appl. No. 17/636,099, mailed Jul. 31, 2024.
Office Action for U.S. Appl. No. 17/636,108, mailed Jul. 18, 2024.
Notification of First Office Action (Including Translation) for corresponding Chinese Patent Application No. 202080071849.1, mailed May 7, 2024.
U.S. Appl. No. 18/931,684, filed Oct. 30, 2024, Price et al.

(56) References Cited

OTHER PUBLICATIONS

Notification of First Office Action (Including Translation) for corresponding Chinese Patent Application No. 202080073505.4, mailed Dec. 26, 2024.
Notification of Second Office Action (Including Translation) for corresponding Chinese Patent Application No. 202080071849.1, mailed Oct. 30, 2024.
Office Action (Restriction Requirement) for U.S. Appl. No. 17/636,090 mailed Dec. 23, 2024.
Notice of Allowance for U.S. Appl. No. 17/636,108, mailed Dec. 29, 2024.
Notification of Third Office Action (Including Translation) for corresponding Chinese Patent Application No. 202080071849.1, mailed Mar. 18, 2025.
Notice of Allowance for U.S. Appl. No. 17/636,083, mailed Mar. 7, 2025.
Office Action for U.S. Appl. No. 17/636,090 mailed Apr. 23, 2025.
U.S. Appl. No. 19/222,511, filed May 29, 2025, Price et al.
Notification of Second Office Action (Including Translation) for corresponding Chinese Patent Application No. 202080073505.4, mailed Jun. 30, 2025.

* cited by examiner

THIN-FILM COMPONENTS FOR INTEGRATED CIRCUITS

CROSS-REFERENCE TO RELATED APPLICATIONS

This application is a national stage application under 35 U.S.C. 371 of PCT Application No. PCT/GB2020/051990 having an international filing date of 19 Aug. 2020, which designated the United States, which PCT application claimed the benefit of Great Britain Application No. 1912025.2, filed 21 Aug. 2019, Great Britain Application No. 1913610.0, filed 20 Sep. 2019, Great Britain Application No. 1915158.8, filed 18 Oct. 2019, and Great Britain Application No. 1917079.4, filed 22 Nov. 2019 each of which are incorporated herein by reference in their entirety.

FIELD OF THE DISCLOSURE

The present disclosure relates to thin-film components, and in particular, thin-film components for thin-film integrated circuits, and methods for manufacturing thin-film components.

BACKGROUND OF THE DISCLOSURE

Integrated circuits (ICs) often require or may benefit from the inclusion of a wide range of integrated resistor values in order to provide a range of different functionalities that require the control of voltages and/or currents within the IC. For example, relatively high value resistors may be required for voltage dividers, biasing networks, and timing circuits, and relatively low-value resistors may be required for pull-up/pull-down in logic gates and low-frequency oscillators. In particular, resistors values required to provide these and other functionalities may be anywhere between 100Ω and 100MΩ.

However, providing such a range of integrated resistors in low-cost ICs, such as flex or thin-film ICs for example, can be challenging due to constraints of materials, available footprint and the total number of process steps. For example, although it may be possible to fabricate particular resistor values using the available materials e.g. ones with different resistivities, the resulting footprint of the resistor may not be practical. Furthermore, the constraints imposed by the available materials and/or minimum feature size may limit the accuracy with which resistor values may be controlled.

Furthermore, it may also be beneficial to provide additional control of the resistive/current characteristics of other components in integrated circuits, such as field effect transistors for example.

Consequently, there is a need for efficient and low-complexity approaches for providing components for integrated circuits that have wider range of resistive characteristics and/or allow increased control over their resistive characteristics.

BRIEF SUMMARY OF THE DISCLOSURE

It is an aim of certain examples of the present disclosure to provide electronic components for integrated circuits that have a wider range of resistive characteristics and/or allow for additional control over their resistive characteristics and physical dimensions.

According to a first aspect of the present disclosure, there is provided a thin-film electronic component including a first terminal, a second terminal, and a first current path between the first terminal and the second terminal, wherein the first current path is formed from a first segment of a first material and a first segment of a second material arranged in series between the first terminal and the second terminal.

In one example of the present disclosure, the thin-film electronic component is a resistor and the first material has a resistivity at least an order of magnitude higher than the resistivity of the second material.

In another example of the present disclosure, the thin-film electronic component includes a second current path between the first terminal and the second terminal that is in parallel to the first current path, the second current path being formed from a second segment of the first material and a second segment of the second material arranged in series between the first terminal and the second terminal.

In another example of the present disclosure, the first segments of the first and second materials of the first current path are arranged in an opposite order to the second segments of the first and second materials of the second current path.

In another example of the present disclosure, the dimensions of the first and second segments of the first material are approximately equal, and the dimensions of the first and second segments of the second material are approximately equal.

In another example of the present disclosure, the thin-film electronic component is a thin-film transistor, TFT, and the first terminal is a source terminal of the TFT and the second terminal is a drain terminal of the TFT, and the first segments of the first and second materials form the channel of the TFT, and wherein the first material is a resistive material and the second material is a semiconducting material.

In another example of the present disclosure, the first segment of the second material includes a first part and a second part, the first part extending from one of the source terminal and the drain terminal to meet the first segment of the first material, and the second part extending from the source terminal to the drain terminal.

In another example of the present disclosure, the resistivity of the first material is less than the resistivity of the second material when the TFT is in an on-state.

In another example of the present disclosure, the first segment of the first material adjoins one of the source terminal and the drain terminal.

In another example of the present disclosure, the first segment of the second material includes a third part, and the first segment of the first material is arranged in series between the first and third parts of the second material in the first current path.

In another example of the present disclosure, the TFT includes a second current path between the source terminal and the drain terminal that is in parallel to the first current path, the second current path being formed from a second segment of the first material and a second segment of the second material arranged in series between the first terminal and the second terminal.

In another example of the present disclosure, the first segments of the first and second materials of the first current path are arranged in an opposite order to the second segments of the first and second materials of the second current path.

In another example of the present disclosure, the first material and the second material are formed from a same source material.

According to a second aspect of the present disclosure, there is provided a thin-film IC including a thin-film electronic component as described above.

According to a third aspect of the present disclosure, there is provided a method for fabricating a thin-film electronic component, the thin-film electronic component including a first terminal, a second terminal, and a first current path between the first terminal and the second terminal, wherein the first current path is formed from a first segment of a first material and a first segment of a second material arranged in series between the first terminal and the second terminal, and the method comprising depositing a layer of the first material, patterning the layer of first material to form the first segment of the first material, depositing a layer of the second material, patterning the layer of the second material to form the first segment of the second material, depositing a layer of conductive material; and patterning the layer of conductive material to form the first and second terminals between which the first segments of the first and second materials form the first current path.

In another example of the present disclosure, the thin-film electronic component is a resistor and the first material has a resistivity at least an order of magnitude higher than the resistivity of the second material.

In another example of the present disclosure, the thin-film electronic component is a thin-film transistor, TFT, and the first terminal is a source terminal of the TFT and the second terminal is a drain terminal of the TFT, and the first segments of the first and second materials form the channel of the TFT, and wherein the first material is a resistive material and the second material is a semiconducting material.

In another example of the present disclosure, the thin-film electronic component includes a second current path between the first terminal and the second terminal that is in parallel to the first current path, the second current path being formed from a second segment of the first material and a second segment of the second material arranged in series between the first terminal and the second terminal, and wherein the patterning of the layer of the first material forms the second segment of the first material; and the patterning of the layer of the second material forms the second segment of the second material.

BRIEF DESCRIPTION OF THE DRAWINGS

Embodiments of the present disclosure are further described hereinafter with reference to the accompanying drawings, in which.

DETAILED DESCRIPTION

In accordance with the present disclosure, a wider range of resistances and increased control over resistances may be provided in an integrated circuit (IC), and in particular low-cost ICs such as thin-film ICs and flex-ICs, by utilising composite structures that include at least two different materials with different resistive properties. In particular, two or more segments of different materials with different resistive or electrical properties may be arranged in series between electrical contacts/terminals of a component in order to provide a current path with a particular resistance.

Figure 1:
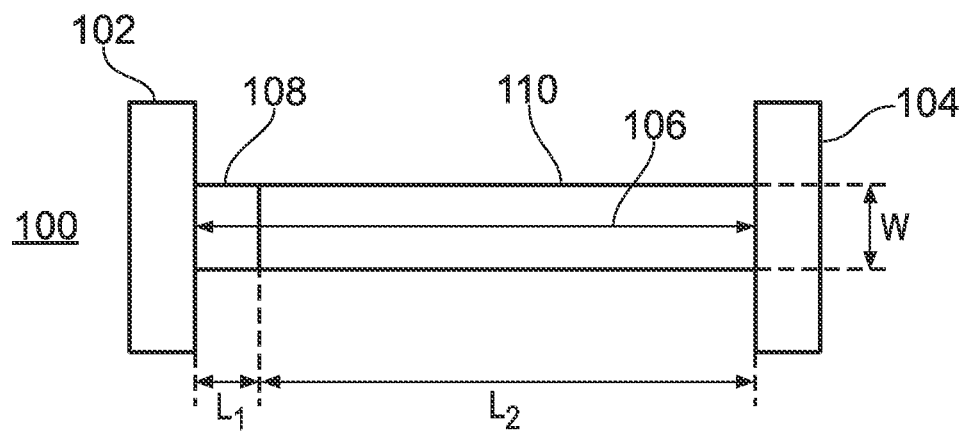
FIG. 1 provides a schematic diagram of a composite resistor that is in accordance with the present disclosure.

FIG. 1 provides an illustrative top-down view of a composite resistor 100 for an IC that is in accordance with the present disclosure. The composite resistor 100 includes a first terminal 102, a second terminal 104, and a current path 106, where the current path 106 is formed from a segment of a first material 108 and a segment of a second material 110, where the segments are arranged in series between the first terminal 102 and the second terminal 104. The first and second materials are different and thus will have different resistivities.

In FIG. 1 the segment of the first material 108 has a length $L_1$ and the segment of the second material 110 has a length $L_2$, and both the segment of the first material and the segment of the second material have a width w. However, although shown as different in FIG. 1, the lengths $L_1$ and $L_2$ may be equal and the widths of the segments of the first and second materials may be different. The thicknesses of the two segments may also be equal or different.

In thin-film ICs the thicknesses of the layers of the first and second materials may be approximately equal and thus their resistivities can be expressed as resistance per square of the respective material ($\Omega/\square$), where the resistance per square in FIG. 1 for the first material is represented by $\rho_1$ and the resistance per square for the second material is represented by $\rho_2$. The resistivities $\rho_1$ and $\rho_2$ may vary by an order of magnitude or more but are not limited to such characteristics. For example, $\rho_1$ may be 5 M$\Omega/\square$ and $\rho_2$ may be 5 k$\Omega/\square$. Given this, presuming an equal thickness of the segments 108 and 110, the resistance of the current path 106 between the first and second terminals 102 and 104 will be given by $R=R_1+R_2=\rho_1 L_1 W + \rho_2 L_2 W$, where $R_1$ and $R_2$ represent the resistances of the segments 108 and 110, respectively.

A number of advantages may arise from the use of a composite resistor in ICs such as thin-film ICs.

Firstly, by appropriately selecting the first and second materials along with the lengths $L_1$ and $L_2$, resistor values that fall outside those that may be practically provided using resistors formed from only the first material or the second material may be formed. For example, in order to provide a resistor value of 1.05M$\Omega$, if only the first material is used it may not be possible to accurately control the size of the first material to provide the specific resistance because of the minimum resolution of the fabrication technique and the high resistivity of the first material. However, if only the second material is used, the required size of the second material may become unreasonably large and thus not represent efficient use of available space within the IC. For example, the higher resistivity material may be used to provide the bulk of the resistance and the low resistivity material may be used to fine tune the value of the resistor. Furthermore, if two separate resistors were used, the complexity of the fabrication process may be increased and also more space in the IC may be required. In other words, by utilising two materials with different resistivities in a composite resistor, a wider range of resistances may be provided and/or resistors of particular values may be provided more efficiently.

Secondly, intermediate resistor values (i.e. resistor values that fall between those that may be practically provided by resistors formed from only the first or second material) may be provided.

Thirdly, the flexibility that the use of multiple segments and thus multiple materials provides may allow resistors in a thin-film IC to be standardised in dimensions whilst not significantly limiting the value of the resistors that may be provided. For example, by appropriate selection of the first and second materials and also the lengths of the segments of the first and second materials, different value resistors may have approximately equal dimensions, thus providing improvements in terms of the complexity of IC design by allowing resistors of different values to be placed on a regularly sized grid. Alternatively, by making use of the additional control over resistor dimensions that results from the use of two materials, resistor dimensions may be controlled to be multiples or fractions of a base grid dimension for an IC, thus allowing reduced complexity IC design.

Although the composite resistor of FIG. 1 includes two segments in the current path 106, two or more segments/different materials may be used in order to provide additional control over the resistor values that may be provided and their associated dimensions.

FIGS. 2a to 2f provide an example fabrication process for the composite resistor of FIG. 1.

Figure 2A:
FIGS. 2a to 2f provide an illustration of a fabrication process for fabricating a composite resistor that is in accordance with the present disclosure.

In FIG. 2a a layer 204 of the first material has been deposited on a substrate 202.

Figure 2B:

In FIG. 2b the layer 204 of the first material has been patterned (e.g. masked and etched) to form the segment of the first material 206.

Figure 2C:
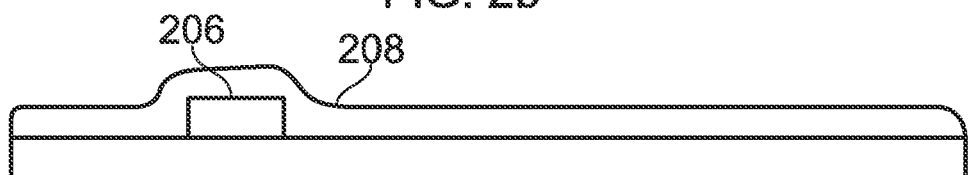

In FIG. 2c a layer 208 of the second material has been deposited on the substrate 202 and the segment of the first material 206.

Figure 2D:
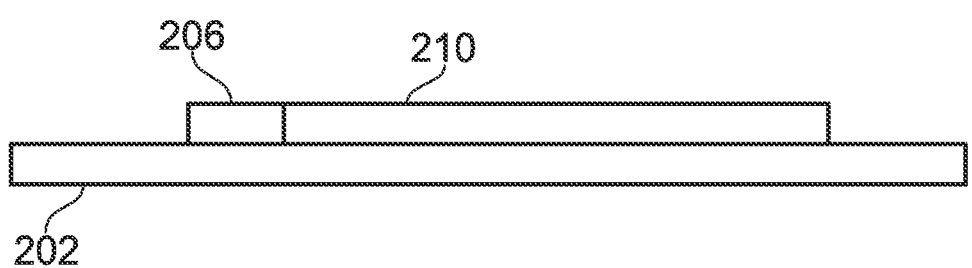

In FIG. 2d the layer 208 of the second material has been patterned to form the segment of the second material 210. Although the segment of the second material is shown to be adjacent to and in contact with only an edge of the segment of the first material, the segment of the second material may partially overlap the segment of the first material. In this case, the segment of the second material may contact both an edge and the upper surface of the segment of the first material. This partial overlapping may reduce the demands on the accuracy of the patterning process.

Figure 2E:
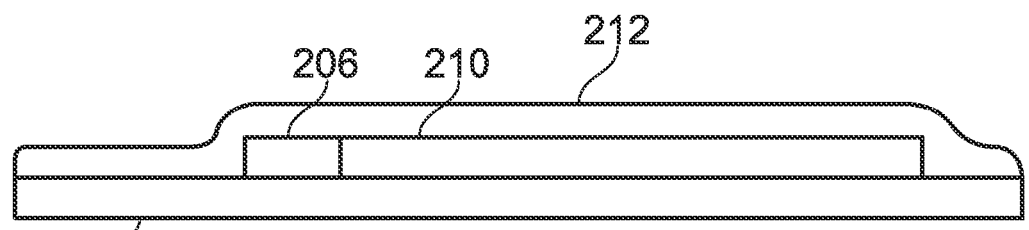

In FIG. 2e a layer 212 of a material for forming the terminals of the composite resistor is deposited on the substrate 202 and the segments of the first and second materials 206, 210.

Figure 2F:
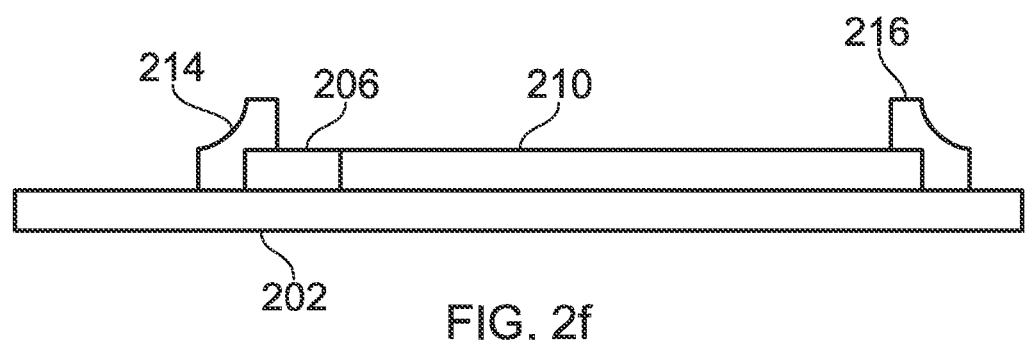

Lastly, in FIG. 2f the layer of material for forming the terminals has been patterned to form the first terminal 214 and the second terminal 216 of the composite resistor.

Although a particular ordering of the stages has been provided by FIGS. 2a to 2f, this order may be changed, stages removed, and/or additional stages introduced. For example, the segments of the first and second materials may be formed in a different order, additional materials may be used in order to provide etch-stop layers, and different components may be fabricated in conjunction with the composite resistor.

Furthermore, in FIG. 2 it is assumed that the first and second materials are different i.e. different source materials are deposited to form the segments of the resistor. However, in some examples, a single source material may be used to form the segments of the resistor with the differing characteristics (i.e. resistivity) of each segment resulting from controlling deposition conditions to be different for the first and second materials, controlling the properties of the substrate material onto which the first and/or second material is deposited such that it causes differences in the electrical properties of the first and second materials (e.g. by doping), and/or processing of the segments after deposition, for example, via annealing or exposure to electromagnetic radiation.

In an example fabrication process, a single deposition step may be used to deposit the material used to form the body of the resistor, such that a layer of a first material may be deposited onto a substrate, and the layer of the first material patterned to form the body of the resistor (i.e. the first and second segments). A portion of the deposited first material intended to form the first segment may then be processed via annealing or exposure to electromagnetic radiation in order to alter its electrical properties so that it has a first resistivity. Alternatively, or in addition to this processing e.g. when the first material already has the first resistivity, a portion of the deposited first material intended to form the second segment may be processed via annealing or exposure to electromagnetic radiation in order to alter its electrical properties so that it has a second resistivity. Subsequently, a layer of a conductive material may be deposited and patterned to form the terminals of the resistor between which the first and second segments form the current path. However, the deposition and patterning of the conductive material may occur at any point during the fabrication process. In another example, the step(s) of annealing/exposure to electromagnetic radiation may be replaced with appropriate doping or other processing of the substrate prior to the deposition of the layer of the first material.

Although the composite resistor of FIG. 1 may provide a number of advantages in terms of available resistor values and IC design, due to the use of multiple materials, possibly with significantly different resistivities, to form the segments of the resistor, misalignment in the patterning of the layers used to form the individual segments shown in FIGS. 2a to 2f may result in differences between the desired and actual lengths of the segments that in turn may lead to differences between the desired and actual resistance of the composite resistor.

Figure 3:
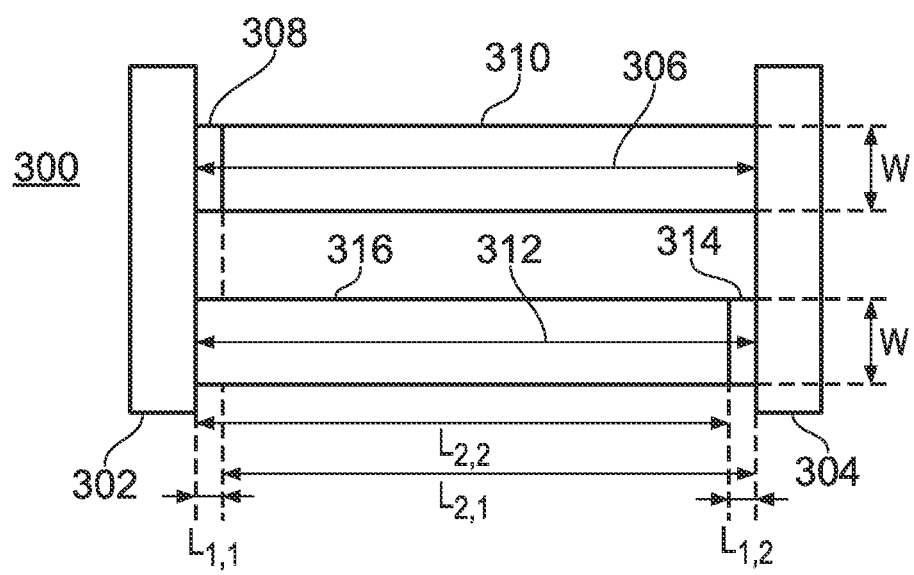
FIG. 3 provides a schematic diagram of a parallel composite resistor that is in accordance with the present disclosure.

FIG. 3 provides an illustrative top-down view of an alternative structure for a composite resistor in accordance with the present disclosure. The composite resistor of FIG. 3 may be used for the same purpose as that of FIG. 1 and may provide at least some of the same advantages; however, the alternative structure may aid in reducing differences between desired and actual resistances that may result from misalignment of layers and thus inaccuracies in the lengths of the segments.

The composite resistor of FIG. 3 includes two parallel current paths between the terminals, where the ordering of the segments that form each of the current paths is reversed, such that the resistor of FIG. 3 may be considered to be formed from two of the resistors of FIG. 1 but where they have the reverse segment ordering.

More specifically, the parallel composite resistor 300 of FIG. 3 includes a first terminal 302, a second terminal 304, and a first current path 306, where the first current path 306 is formed from a first segment of a first material 308 and a first segment of a second material 310 that are arranged in series between the first terminal 302 and the second terminal 304. The parallel composite resistor 300 also includes a second current path 312, where the second current path 312 is formed from a second segment of the first material 314 and a second segment of the second material 316 that are arranged in series between the first terminal 302 and the second terminal 304, such that the first current path 306 and the second current path 312 are in parallel between the first and second contacts 302, 304.

The first segment of the first material 308 has a length $L_{1,1}$ and the first segment of the second material 310 has a length $L_{2,1}$. The second segment of the first material 314 has a length $L_{1,2}$ and the second segment of the second material 316 has a length $L_{2,2}$. All the segments have a width w and the thicknesses of the segments are presumed to be approximately equal so that the resistivities of the first and second materials can be expressed per square as $\rho_1$ and $\rho_2$, respectively. However, although shown as different in FIG. 1, the lengths $L_1$ and $L_2$ may be equal and/or the widths of the segments of the first and second materials may be different. The thicknesses of the two segments may also be equal or different.

The resistance $R_1$ of the first current path 306 (i.e. the first resistor) is given by $R_1 = R_{1,1} + R_{2,1} = \rho_1 L_{1,1} W + \rho_2 L_{2,1} W$ and the resistance R2 of the second current path 312 (i.e. the second resistor) is given by $R_2 = R_{1,2} + R_{2,2} = \rho_1 L_{1,2} W + \rho_2 L_{2,2} W$, and the total resistance of the resistor 300 is given by $R_T = R_1 R_2 / (R_1 + R_2)$.

By virtue of the structure of the resistor 300, inaccuracies in the alignment of the layers used to form the various segments of the resistor may be partially compensated for. For example, if the alignment of the layers used to form the segments is moved left, a decrease in the resistance provided by the first segment of the first material 308 will be partially compensated by an increase in resistance provide by the second segment of the first material 314, thus reducing the effects of misalignment that may occur during fabrication.

With reference to a practical example, if $\rho_1$ is 5 MΩ/☐ and $\rho_2$ is 50 kΩ/☐, the intended lengths are $L_{1,1} = L_{1,2} = 0.2$ μm and $L_{2,1} = L_{2,2} = 10$ μm, and the width is 2 μm the total resistance will be 0.375MΩ. However, if there is a misalignment of 0.05 μm between the resistive material layers, or between a resistive material layer and the layer(s) forming the terminals, in a direction parallel to the current paths, such that $L_{1,1} = 0.25$ μm, $L_{1,2} = 0.15$ μm, $L_{2,1} = 9.95$ μm, and $L_{2,2} = 10.05$ μm, the total resistance will be 0.365MΩ. Consequently, for 0.05 μm misalignment (25% error in alignment with respect to intended lengths of $L_{1,1}$ and $L_{1,2}$) there is a 2.67% error in the resulting resistance.

In contrast, if the composite resistor of FIG. 1 has the same parameters as that of FIG. 3 ($\rho_1$ is 5 MΩg/☐ and $\rho_2$ is 50 kΩ/☐, L1=0.2 μm and L2=10 μm), the resistance will be 0.75MΩ but with a misalignment of 0.05 μm, the resistance will be 0.87375MΩ. Consequently, for 0.05 μm misalignment (25% error in alignment with respect to intended lengths $L_1$) there is a 16.5% error in the resulting resistance.

Although the composite parallel resistor of FIG. 3 has been illustrated as being formed with two current paths, with each current path being formed from two segments of different materials, the number of current paths and number of segments in each current path may vary and are not limited to two. The fabrication of the parallel composite resistor of FIG. 3 may be performed using any suitable technique; however, the advantages in terms of misalignment will more readily be realised when the first and second segments of the first material are formed in the same patterning step and/or the first and second segments of the second material are formed in the same patterning step, and/or the first and second terminals are formed in the same patterning step.

Thus far, the composite resistors have been considered as independent components within an IC, but the concept of forming current paths from multiple materials arranged in series in order to provide additional control over resistances may be applied to/incorporated into other components where finer control over resistance values and therefore current/voltages would be desirable.

In accordance with another example in accordance with the present disclosure, the concept of forming current paths from multiple materials arranged in series may be applied to the channel of a field-effect transistor (FET) and metal oxide semiconductor FETs (MOSFETs), such as a thin-film transistor (TFT) for example, such that the resistance of the channel when in an on-state can be more finely controlled. For example, the resistance of the channel may be decreased when the TFT is in an on-state without substantially decreasing its resistance when the TFT is in an off-state by introducing a resistive insert into the channel, such that the channel has a composite structure. The TFT may be NMOS or PMOS, and may form part of a unipolar IC or a CMOS IC. Furthermore, although TFTs are predominantly referred to, the channel structures are not limited to only TFTs but may be applied to other types of FETs.

Figure 4A:
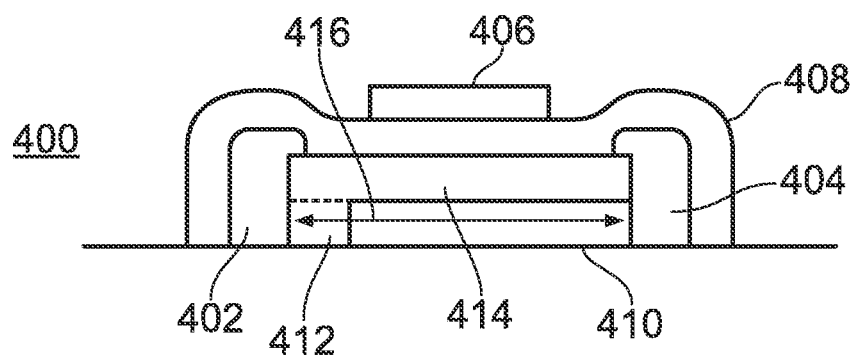
FIGS. 4a and 4b provides schematic diagrams of thin-film transistors with a composite channel that are in accordance with the present disclosure.

FIG. 4a provides an illustration of a first example TFT structure where the current path of the channel is at least partially formed from a composite of materials. In FIG. 4a the TFT 400 includes a source terminal 402, a drain terminal 404, a gate terminal 406, a gate dielectric 408, and a channel formed from a segment of a first material 410 (e.g. a resistive material) that extends from a first terminal to within a short distance of the second terminal, and a semiconductor formed from a first part 412 and a second part 414, where the first part 412 is positioned in series between the segment of the first material and the second terminal in order to form a first current path 416.

Although semiconductor parts 412 and 414 have been labelled separately and distinguished from one another in FIG. 4a, this is for ease of description and in practice they are likely to be contiguous and formed from a same deposition layer. With respect to the language used in the description of the composite resistors, the segment of 410 may be considered to be the first segment of a first material in a current path between the source and drain terminals and the first part of the semiconductor 412 may be considered to be the first segment of a second material in the current path between the source and drain terminals. Furthermore, although the semiconducting material of the channel of the TFT 400 has been illustrated as being formed from a first part 412 and a second part 414, in some examples only the first part 412 will be present.

When the TFT 400 is in an off-state the semiconducting parts 412 and 414 are in a substantially non-conducting state, and therefore substantially no current flows between the drain and source terminals and the presence of the segment of resistive material 410 does not substantially affect i.e. increase the off-state current of the TFT. However, when in the on-state, if the first material has been chosen to have a resistivity lower than that of the channel semiconductor when the TFT is in the on-state, the overall resistance of the channel will be lower than that if the channel was solely formed from the semiconductor instead of the segment of the first material being present as a resistive insert into the channel.

By virtue of providing a composite channel, not only can the on-state resistance and current of the TFT be more finely controlled, but characteristics similar to that of a shorter channel may be achieved without physically shortening the channel. For example, a channel with on-state characteristics normally associated with a channel that has a length below that of the minimum available in-layer feature size in the IC may be achieved. This example may be appreciated from FIG. 4a by minimising the length of semiconducting part 412, so that the resistance of the TFT channel in the on-state is also minimised.

Figure 4B:
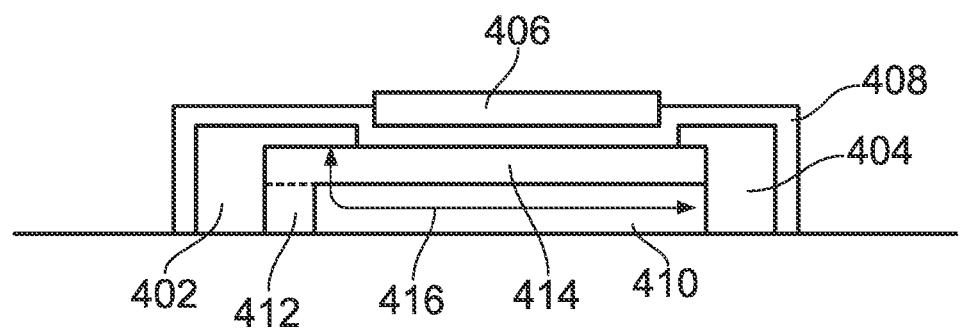

One way of achieving a similar aim is illustrated in FIG. 4b, in which the conducting terminal closest to the semiconducting part 412 (in this case the source terminal 402) extends over the upper surface of semiconducting part 414 such that the current path 416 passes substantially vertically through the thickness of the semiconducting part 414. The on-state channel resistance is then dependent on the thickness of the semiconducting part 414, which may be of the order 10-300 nm, and which may be more easily controlled than the length of semiconducting part 412 (i.e. the length of the current path through semiconducting part 412 indicated in FIG. 4a). Because the conducting terminal 402 and the resistive material 410 are patterned in different layers their lateral overlap may be defined more precisely than an in-layer feature, due to the high overlay precision of optical lithography tools (~30 nm) compared to their in-plane optical resolution (~500 nm). If the resistivity of the resistive material 410 is significantly less than the resistivity of the semiconducting part 414 in the on-state, the effective on-state resistance of the TFT may be significantly reduced.

Alternatively, this additional control over the on-state resistance of the channel may allow TFTs with a standardised channel length to be used in an IC without substantially reducing the ability to control the resistive/current characteristics of the channel. By lowering the resistance of the channel, TFTs may also be able to be applied to higher power (i.e. current) applications with reduced losses and heat generation caused by the resistance of the channel.

Figure 5:
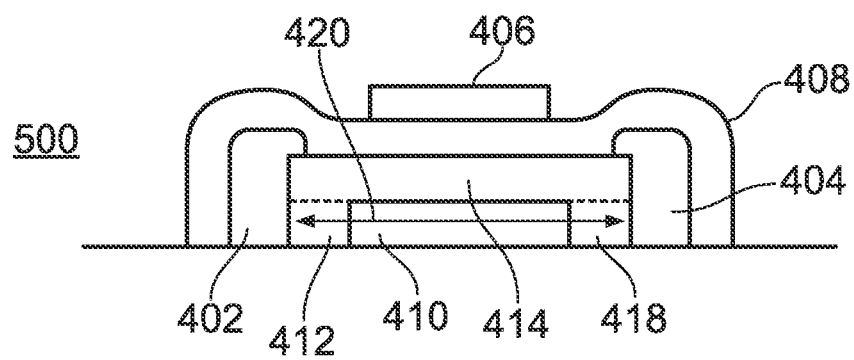
FIG. 5 provides a schematic diagram of a thin-film transistor with a composite channel that is in accordance with the present disclosure.

FIGS. 4a and 4b illustrates a TFT in which the semiconductor is formed from two parts of semiconductor, but in some examples the semiconductor may include a third part, as illustrated by FIG. 5.

More specifically, in FIG. 5 the channel includes a third semiconductor part 418 that is positioned such that the segment of the first material is in series between the first and third parts of the first segment of semiconductor to form a first current path 420, and is not directly adjacent to either of the source or drain terminals.

Figure 6:
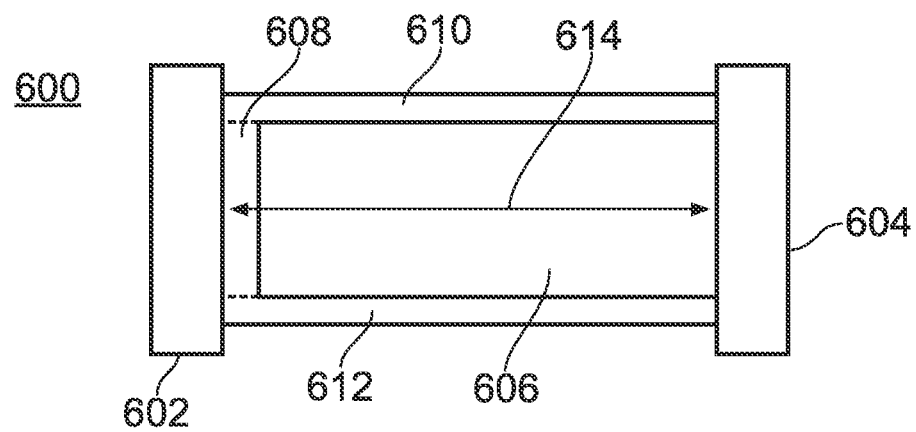
FIG. 6 provides a schematic diagram of a thin-film transistor with a composite channel that is in accordance with the present disclosure.

FIG. 6 provides another alternative channel structure of a TFT. More specifically, FIG. 6 provides an illustrative top-down view of a TFT 600 where the gate and gate dielectric are not shown in order not to obstruct the view of the channel. The channel between the source terminal 602 and the drain terminal 604 is formed from a segment of a first resistive material 606, that is enclosed by first 608, second 610, and third 612 parts of the channel semiconductor, where the segment of the first material may be considered to be in series with the first part 608 of the semiconductor between the source and drain terminals and forms a first current path 614 between the source and drain terminals 602 604. In a variant of this structure, a fourth part of the channel semiconductor may be provided to overlie the first 608, second 610, and third 612 parts of the channel semiconductor and the segment of first resistive material 606.

Figure 7:
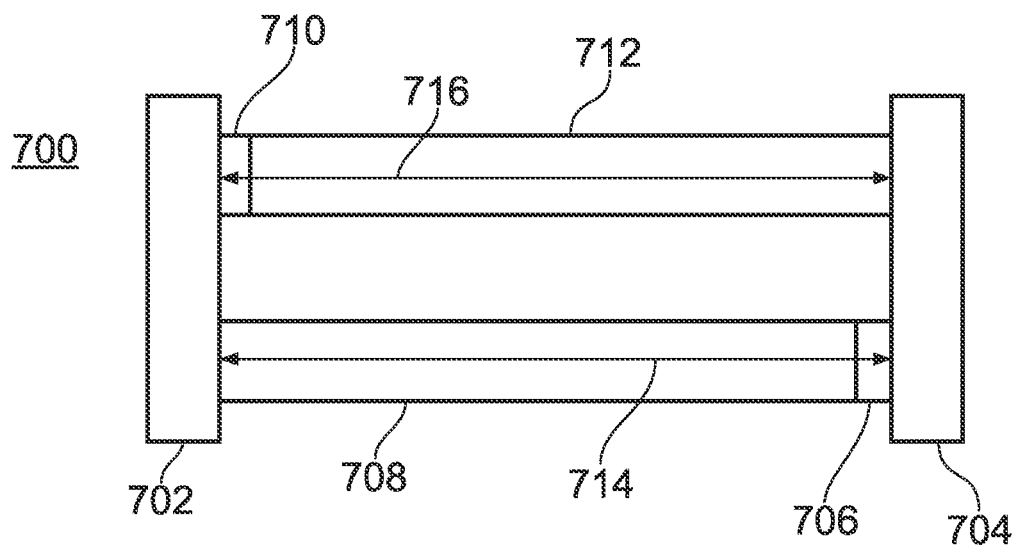
FIG. 7 provides a schematic diagram of a thin-film transistor with a composite channel that is in accordance with the present disclosure.

FIG. 7 provides another alternative channel structure of a TFT. More specifically, the channel structure is based on the parallel composite resistor structure of FIG. 3 in order to reduce the effects of patterning/layer alignment on the current/resistive characteristics of the TFT channel.

In FIG. 7, the source terminal 702 and the drain terminal 704 have two parallel (first and second) current paths 714 and 716 between them, where the first current path 714 is formed from a first segment of a first resistive material 708 and a first segment of a second semiconducting material 706 arranged in series, and the second current path 716 is formed from a second segment of the first resistive material 712 and a second segment of the second semiconducting material 710 arranged in series. In other words, the channel is effectively formed form two parallel composite channels.

Figure 8:
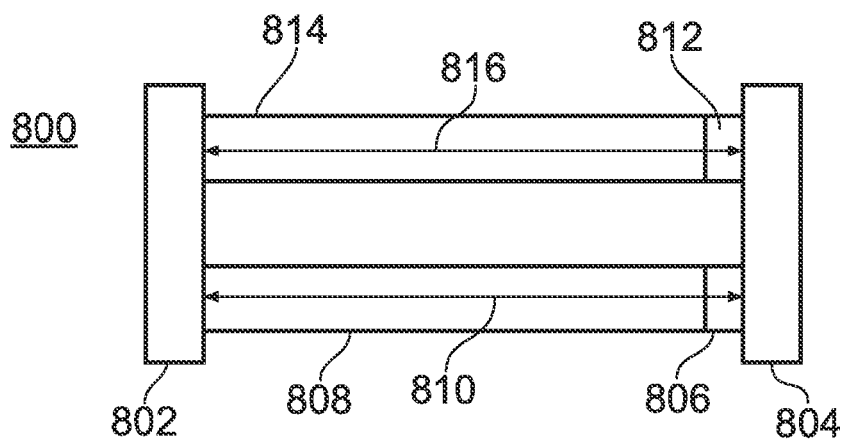
FIG. 8 provides a schematic diagram of a thin-film transistor with a composite channel that is in accordance with the present disclosure.

FIG. 8 provides yet another alternative channel structure of a TFT, where two current paths are provided between the drain and source terminal but where ordering of the materials that form each current path are not reversed as shown in FIG. 7. More specifically, a first current path 810 between the source terminal 802 and the drain terminal 804 is formed from a first segment of a first semiconducting material 806 and a first segment of a second resistive material 808. A second current path 816 is provided in parallel between the source terminal 802 and the drain terminal 804 formed form a second segment of the first semiconducting material 812 and a second segment of the first resistive material 814.

The transistors of FIGS. 4 to 8 may be fabricated using any suitable procedure, with an example fabrication procedure for the TFT of FIGS. 4a and 4b given by FIGS. 9a to 9h.

Figure 9A:
FIGS. 9a to 9h provide an example fabrication process for fabricating a thin-film transistor with a composite channel that is in accordance with the present disclosure.

In FIG. 9a a layer of a resistive material 904 (i.e. a first material) is deposited on a substrate 902, where the resistive material may be selected to provide the required on-state resistance of the TFT channel.

Figure 9B:
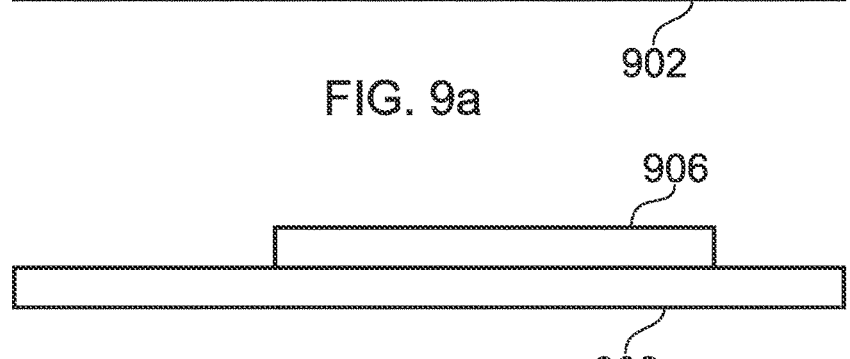

In FIG. 9b the layer of the resistive material 904 has been patterned in order to form the resistive channel insert 906, which may also be referred to as a first segment of the first material.

Figure 9C:
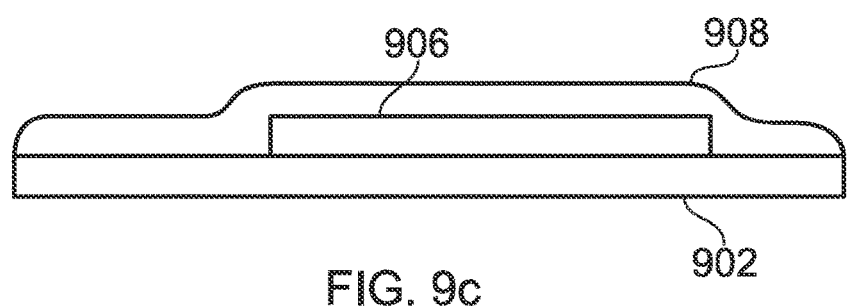

In FIG. 9c a layer of a semiconducting material (i.e. a second material) is deposited over the substrate 902 and the resistive channel insert 906.

Figure 9D:
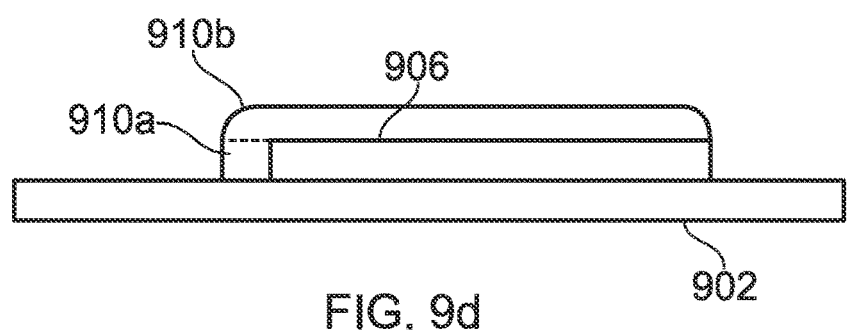

In FIG. 9d the layer of semiconductor has been patterned to form the semiconducting channel of the TFT, whereas described with reference to FIGS. 4a and 4b, the semiconducting material may be considered to be formed of a first part 910a and a second part 910b, but in practice these parts are formed from a contiguous portion of semiconducting material.

Figure 9E:
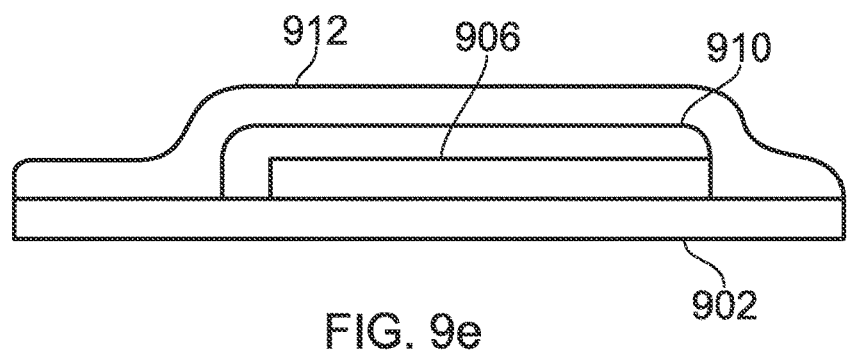

In FIG. 9e a layer of a conducting material 912 is deposited in order to form the source and drain terminals of the TFT.

Figure 9F:
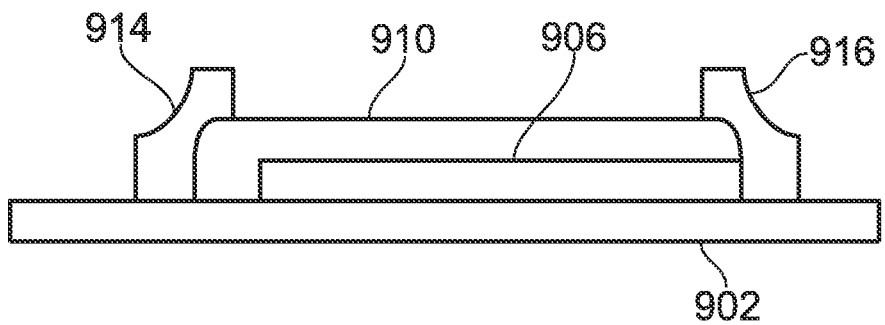

In FIG. 9f the layer of conductive material has been patterned to form the source terminal 914 and the drain terminal 916 of the TFT.

Figure 9G:
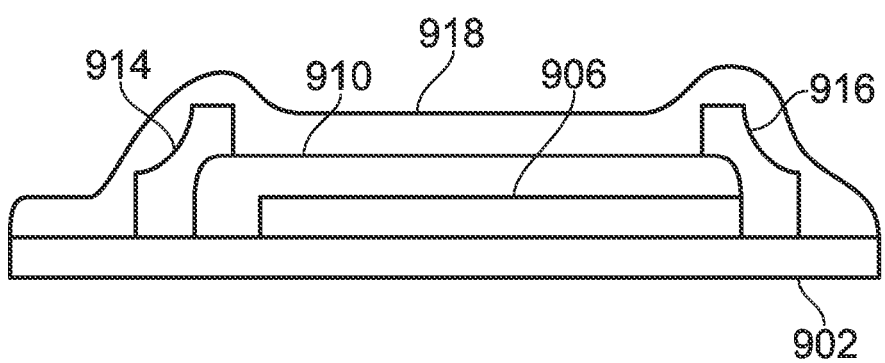

In FIG. 9g a layer of a dielectric 918 has been deposited over the structures in order to form the gate dielectric.

Figure 9H:
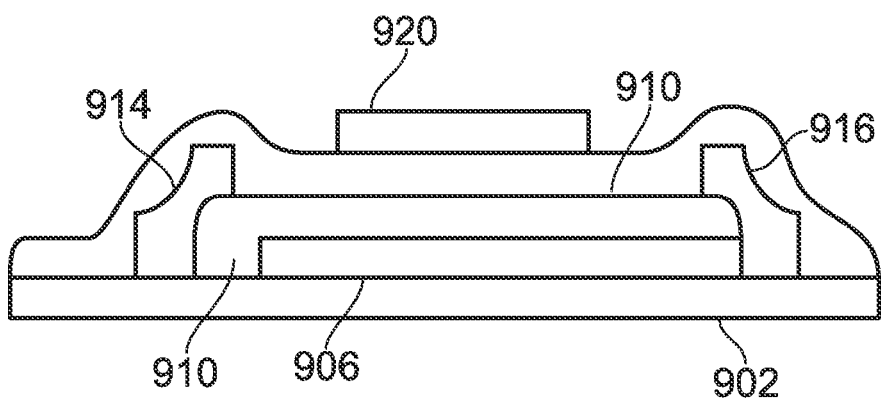

Lastly, in FIG. 9h a layer of a conductive material has been deposited and patterned to form the gate terminal 920.

The structures of FIGS. 9a to 9h have been simplified in order to more clearly illustrate the fabrication procedure and therefore connections from the terminals of the TFT to other components in the TFT are not shown. However, in practice any suitable interconnects may be used to electrically connect the TFT to other components in the IC. These considerations and simplifications also apply to the other structures and fabrication processes illustrated in the figures.

Fabrication procedures similar to that illustrated by FIGS. 9a to 9h may also be used to fabricate the other TFT structures of FIGS. 4 to 8. For example, one of more of the patterning steps and ordering of material deposition may be altered in order to achieve the various TFT structures of FIGS. 4 to 8.

The first and second materials used to form the composite resistors and also the materials used to form the channel of a TFT may take many forms, for example, the materials may be a metal such as Au, Ti, Al, Mo, Pt, Pd, Ag, Cu, Ni, Cr, Ta, W; a metal alloy such as MoNi, MoCr, AlSi; a transparent conductive oxide (such as ITO, IZO, AZO); a metal nitride such as TiN; a carbon material such as carbon black, carbon nanotubes, graphene; a conducting polymer such as polyaniline, PEDOT:PSS; or a semiconductor material.

Alternatively, one or more of the first and second materials may be based on a semiconducting material, for example, a semiconductor from a list comprising: compound semiconductors (such as GaAs, GaN, InP, CdSe, InGaAs, InGaAsSb), metal oxides such as ZnO, SnO2, NiO, SnO, Cu2O, In2O3, LiZnO, ZnSnO, InSnO (ITO), InZnO (IZO), HfInZnO (HIZO), InGaZnO (IGZO); metal oxynitrides, e.g. ZnxOyNz; inorganic semiconductors (such as amorphous, microcrystalline or nanocrystalline Si); organic semiconductors (such as CuPc, pentacene, PTCDA, methylene blue, Orange G, rubrene); polymer semiconductors (such as PEDOT:PSS, POT, P3OT, P3HT, polyaniline, polycarbazole); 2D materials (such as graphene); chalcogenides such as MoS2, GeSbTe; and perovskites (SrTiO3, CH3NH3PbCl3, H2NCHNH2PbCl3, CsSnI3).

In other examples, one or more of these materials may be used but whose electrical properties are altered either during or after deposition in order to achieve the desired resistive and/or semiconductive properties, thus potentially leading to simplified fabrication processes.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A thin-film electronic component including a first terminal, a second terminal, and a first current path between the first terminal and the second terminal, wherein the first current path is formed from a first segment of a layer of a first material and a first segment of a layer of a second material arranged in series between the first terminal and the second terminal, wherein thickness of the layer of the first material has a thickness and the layer of the second material has a thickness, and wherein the thin-film electronic component is a thin film transistor, TFT, and the first terminal is a source terminal of the TFT and the second terminal is a drain terminal of the TFT, and the first segments of the layers of the first and second materials form the channel of the TFT, and wherein the first material is a resistive material and the second material is a semiconducting material.

2. The thin-film electronic component of claim 1, wherein the first segment of the layer of the second material includes a first part and a second part, the first part extending from one of the source terminal and the drain terminal to meet the first segment of the layer of the first material, and the second part extending from the source terminal to the drain terminal.

3. The thin-film electronic component of claim 1, wherein the resistivity of the first material is less than the resistivity of the second material when the TFT is in an on-state.

4. The thin-film electronic component of claim 1, wherein the first segment of the layer of the first material adjoins one of the source terminal and the drain terminal.

5. The thin-film electronic component of claim 1, wherein the first segment of the layer of the second material includes a third part, and the first segment of the layer of the first material is arranged in series between the first and third parts of the layer of the second material in the first current path.

6. The thin-film electronic component of claim 1, wherein the TFT includes a second current path between the source terminal and the drain terminal that is in parallel to the first current path, the second current path being formed from a second segment of the layer of the first material and a second segment of the layer of the second material arranged in series between the first terminal and the second terminal.

7. The thin-film electronic component of claim 6, wherein the first segments of the layers of the first and second materials of the first current path are arranged in an opposite order to the second segments of the layers of the first and second materials of the second current path.

8. The thin-film electronic component of claim 1, wherein the layer of the first material and the layer of the second material are formed from a same source material.

9. A thin-film integrated circuit including the thin-film electronic component of claim 1.

10. The thin-film electronic component of claim 1, wherein the thickness of the layer of the first material is different than the thickness of the layer of the second material.

11. The thin-film electronic component of claim 1, wherein the thickness of the layer of the first material is equal to the thickness of the layer of the second material.

12. A method for fabricating a thin-film electronic component, the thin-film electronic component including a first terminal, a second terminal, and a first current path between the first terminal and the second terminal, wherein the first current path is formed from a first segment of a layer of a first material and a first segment of a layer of a second material arranged in series between the first terminal and the second terminal, and the method comprising:

depositing the layer of the first material;

patterning the layer of first material to form the first segment of the first material;

depositing the layer of the second material;

patterning the layer of the second material to form the first segment of the second material;

depositing a layer of conductive material; and patterning the layer of conductive material to form the first and second terminals between which the first segments of the layers of the first and second materials form the first current path, wherein the layer of the first material has a thickness and the layer of the second material has a thickness, and wherein the thin-film electronic component is a thin-film transistor, TFT, and the first terminal is a source terminal of the TFT and the second terminal is a drain terminal of the TFT, and the first segments of the layers of the first and second materials form the channel of the TFT, and wherein the first material is a resistive material and the second material is a semiconducting material.

13. The method of claim 12, wherein the thickness of the layer of the first material is equal to the thickness of the layer of the second material.

14. The method of claim 12, wherein the thickness of the layer of the first material is different than the thickness of the layer of the second material.

15. A method for fabricating a thin-film electronic component, the thin-film electronic component including a first terminal, a second terminal, and a first current path between the first terminal and the second terminal, wherein the first current path is formed from a first segment of a layer of a first material and a first segment of a layer of a second material arranged in series between the first terminal and the second terminal, and the method comprising:

depositing the layer of the first material;

patterning the layer of first material to form the first segment of the first material;

depositing the layer of the second material:

patterning the layer of the second material to form the first segment of the second material;

depositing a layer of conductive material; and patterning the layer of conductive material to form the first and second terminals between which the first segments of the layers of the first and second materials form the first current path, wherein the layer of the first material has a thickness and the layer of the second material has a thickness, wherein the thin-film electronic component is a resistor and the first material has a resistivity at least an order of magnitude higher than the resistivity of the second material, wherein the thin-film electronic component includes a second current path between the first terminal and the second terminal that is in parallel to the first current path, the second current path being formed from a second segment of the layer of the first material and a second segment of the layer of the second material arranged in series between the first terminal and the second terminal, and wherein the patterning of the layer of the first material forms the second segment of the layer of the first material; and the patterning of the layer of the second material forms the second segment of the layer of the second material.

16. The method of claim 15, wherein the thickness of the layer of the first material is equal to the thickness of the layer of the second material.

17. The method of claim 15, wherein the thickness of the layer of the first material is different than the thickness of the layer of the second material.

* * * * *